(12) United States Patent
Lee et al.

(10) Patent No.: US 10,319,525 B2
(45) Date of Patent: Jun. 11, 2019

(54) MULTI-LAYER CERAMIC CAPACITOR ASSEMBLY

(71) Applicant: SAMSUNG ELECTRO-MECHANICS CO., LTD., Suwon-si, Gyeonggi-do (KR)

(72) Inventors: Soon-Ju Lee, Suwon-si (KR);
Young-Ghyu Ahn, Suwon-si (KR);
Kyoung-Jin Jun, Suwon-si (KR);
Sang-Soo Park, Suwon-si (KR);
So-Yeon Song, Suwon-si (KR);
Heung-Kil Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 1 day.

(21) Appl. No.: 15/851,110

(22) Filed: Dec. 21, 2017

(65) Prior Publication Data
US 2018/0114646 A1    Apr. 26, 2018

Related U.S. Application Data

(63) Continuation of application No. 14/990,332, filed on Jan. 7, 2016, now abandoned.

(30) Foreign Application Priority Data

Jan. 26, 2015    (KR) .................. 10-2015-0012188

(51) Int. Cl.
*H05K 1/11*    (2006.01)
*H05K 1/18*    (2006.01)
(Continued)

(52) U.S. Cl.
CPC .............. *H01G 4/30* (2013.01); *H01G 2/065* (2013.01); *H01G 4/0085* (2013.01);
(Continued)

(58) Field of Classification Search
CPC ............ H01G 4/30; H01G 4/12; H01G 4/248; H01G 4/012; H05K 3/3436; Y02P 70/613
See application file for complete search history.

(56) References Cited

U.S. PATENT DOCUMENTS 4,760,948 A    8/1988 Spiecker
5,931,371 A    8/1999 Pao et al.
(Continued)

FOREIGN PATENT DOCUMENTS

JP    08-130364 A    5/1996
KR    10-2009-0097411 A    9/2009
WO    2014/126084 A1    8/2014

OTHER PUBLICATIONS

Non-Final Office Action issued in corresponding Parent U.S. Appl. No. 14/990,332, dated Sep. 22, 2016.
(Continued)

*Primary Examiner* — Ishwarbhai B Patel
(74) *Attorney, Agent, or Firm* — Morgan Lewis & Bockius LLP

(57) ABSTRACT

A multi-layer ceramic capacitor assembly includes a multi-layer ceramic capacitor comprising a laminate, the laminate having dielectric layers and internal electrodes laminated alternately therein, and external electrodes being electrically connected with the internal electrodes and disposed at end portions of the laminate; and an electrode-forming substrate coupled to the multi-layer ceramic capacitor and having through-holes disposed to correspond to the external electrodes.

2 Claims, 3 Drawing Sheets

(51) Int. Cl.
    H05K 1/02      (2006.01)
    H01G 2/06      (2006.01)
    H01G 4/30      (2006.01)
    H05K 3/34      (2006.01)
    H01G 4/008     (2006.01)
    H01G 4/232     (2006.01)
    H05K 1/14      (2006.01)

(52) U.S. Cl.
    CPC ........... *H01G 4/232* (2013.01); *H05K 1/0271* (2013.01); *H05K 1/111* (2013.01); *H05K 1/181* (2013.01); *H05K 3/3436* (2013.01); *H05K 1/141* (2013.01); *Y02P 70/613* (2015.11)

(56) References Cited

U.S. PATENT DOCUMENTS

| | | |
|---|---|---|
| 6,693,243 B1 | 2/2004 | Oida et al. |
| 2007/0007323 A1 | 1/2007 | Russell et al. |
| 2014/0124256 A1* | 5/2014 | Hattori .................. H01G 2/065 174/260 |
| 2016/0007446 A1 | 1/2016 | Ishikawa et al. |

OTHER PUBLICATIONS

Final Office Action issued in corresponding Parent Application No. 14/990,332, dated Apr. 19, 2017.
Non-Final Office Action issued in corresponding Parent U.S. Appl. No. 14/990,332, dated Sep. 22, 2017.

* cited by examiner

MULTI-LAYER CERAMIC CAPACITOR ASSEMBLY

CROSS-REFERENCE TO RELATED APPLICATIONS

This application is a continuation of U.S. patent application Ser. No. 14/990,332, filed Jan. 7, 2016, now abandoned, which claims the benefit of priority to Korean Patent Application No. 10-2015-0012188, filed with the Korean Intellectual Property Office on Jan. 26, 2015, the contents of which are incorporated herein their entirety.

TECHNICAL FIELD

The present disclosure relates to a multi-layer ceramic capacitor assembly.

BACKGROUND

Multi-layer ceramic capacitors (MLCC) are popularly used in mobile terminals, such as mobile phones. An MLCC may be connected electrically and physically to a circuit board of a mobile terminal by placing an external electrode of the MLCC directly on a surface electrode for mounting to the circuit board and soldering the surface electrode with the external electrode of the MLCC.

However, the MLCC may be mechanically deformed by a change of voltage applied thereto. Moreover, such a deformation may be transferred to the circuit board and cause the circuit board to vibrate, possibly causing acoustic noises that are audible to a human ear.

SUMMARY

One embodiment of the present invention provides a multi-layer ceramic capacitor assembly comprising a multi-layer ceramic capacitor comprising a laminate, the laminate having dielectric layers and internal electrodes laminated alternately therein, and external electrodes being electrically connected with the internal electrodes and disposed at end portions of the laminate; and an electrode-forming substrate coupled to the multi-layer ceramic capacitor and having through-holes disposed to correspond to the external electrodes.

The multi-layer ceramic capacitor assembly may further comprise a first bonding part disposed between the multi-layer ceramic capacitor and the electrode-forming substrate in a region where the external electrodes are not formed and configured to bond the multi-layer ceramic capacitor with the electrode-forming substrate.

The first bonding part may comprise a pair of first bonding pads formed integrally with the multi-layer ceramic capacitor and the electrode-forming substrate, respectively; and a first soldering member configured for soldering the pair of first bonding pads with each other.

The multi-layer ceramic capacitor assembly may further comprise a circuit board having surface electrodes formed on one surface thereof and being coupled to the electrode-forming substrate in such a way that the surface electrodes are electrically connected with the external electrodes through the through-holes.

The electrode-forming substrate may comprise current-carrying soldering members connecting the surface electrodes with the external electrodes through the through-holes in such a way that the surface electrodes are electrically connected, respectively, with the external electrodes.

The multi-layer ceramic capacitor assembly may further comprise second bonding parts disposed at portions of the electrode-forming substrate and the circuit board where the surface electrodes are formed and bonding the electrode-forming substrate with the circuit board.

The second bonding parts each may comprise a second bonding pad integrally formed with the electrode-forming substrate; and a second soldering member connecting the second bonding pad with one of the surface electrodes.

The current-carrying soldering member and the second soldering member may be integrally formed.

Here, in the multi-layer ceramic capacitor assembly, while a circuit board is coupled to the other surface of the electrode-forming substrate, surface electrodes formed on one surface of the circuit board may be electrically connected to the external electrodes of the multi-layer ceramic capacitor through the through-holes.

DETAILED DESCRIPTION

Figure 1:
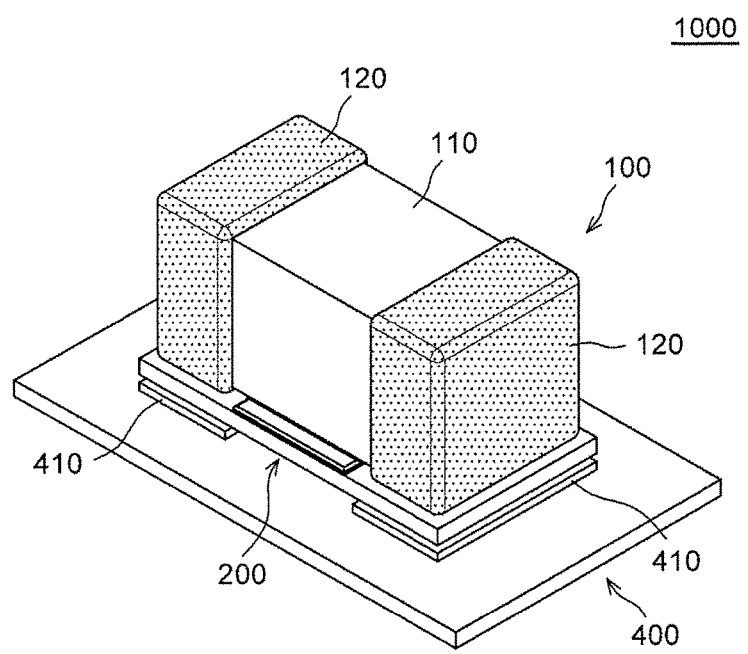
FIG. 1 is a perspective view showing a multi-layer ceramic capacitor assembly in accordance with an embodiment of the present invention.

The terms used in the description are intended to describe certain embodiments only, and shall by no means restrict the present invention. Unless clearly used otherwise, expressions in a singular form also include a meaning of a plural form.

In the present description, when any part is described to "comprise" or "include" any element, it is intended to describe the possibility of encompassing additional element(s), rather than excluding any other element, unless otherwise described. Moreover, when any element is described to be "on," "above" or "over" any part or element, it shall be understood that such element is placed above or below such part or element and not necessarily at a vertically higher position.

When one element is described to be "coupled" to another element, it does not refer to a physical, direct contact between these elements only, but it shall also include the possibility of another element being interposed between these elements and each of these elements being in contact with the other element.

Terms such as "first" and "second" may be used to distinguish one element from other identical or corresponding elements, but the above elements shall not be restricted to the above terms.

The size and thickness of each element shown in the drawings are provided for the convenience of description, illustration, and understanding, and thus the present invention shall not be limited to how the drawings are illustrated.

Hereinafter, an embodiment of a multi-layer ceramic capacitor assembly in accordance with the present invention will be described with reference to the accompanying drawings. In describing the present invention with reference to the accompanying drawings, any identical or corresponding elements will be assigned with same reference numerals, and their description will not be provided redundantly.

Figure 2:
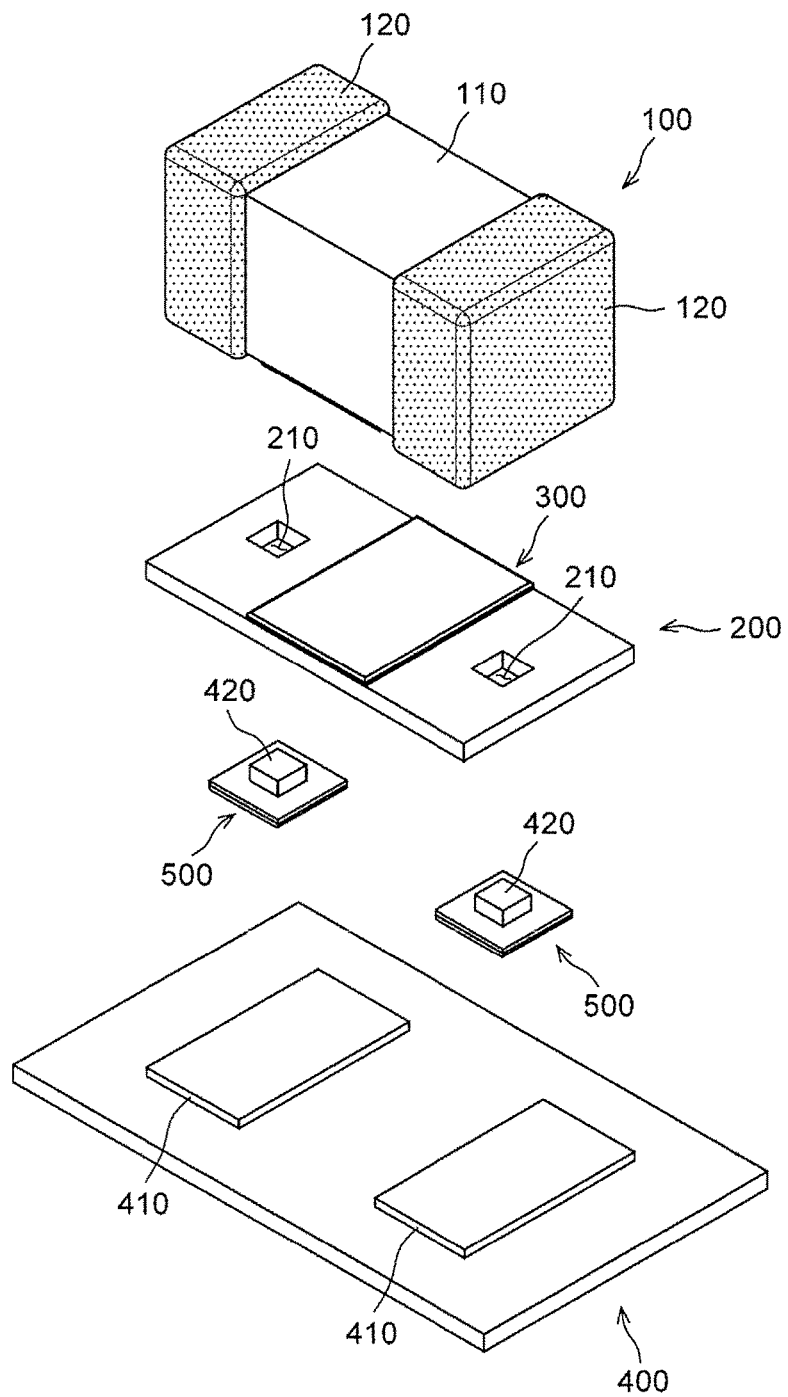
FIG. 2 is an exploded perspective view showing the multi-layer ceramic capacitor assembly in accordance with an embodiment of the present invention.
Figure 3:
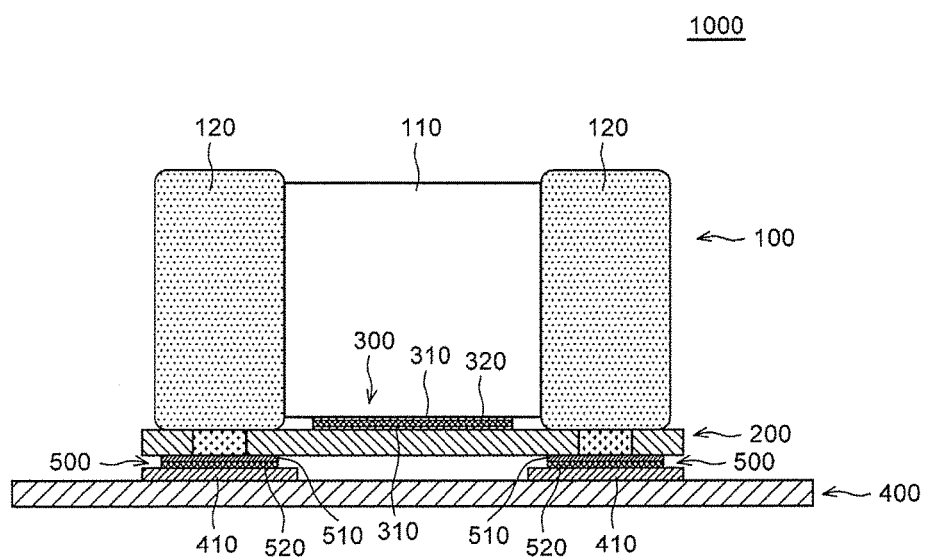
FIG. 3 is a cross-sectional view showing the multi-layer ceramic capacitor assembly in accordance with an embodiment of the present invention.
Figure 4:
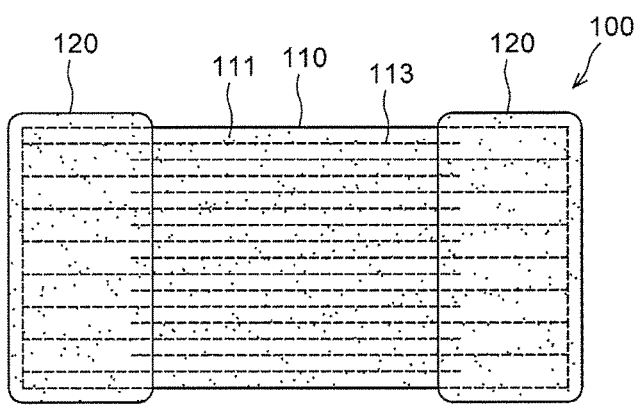
FIG. 4 is a detailed cross-sectional view showing a multi-layer ceramic capacitor in the multi-layer ceramic capacitor assembly in accordance with an embodiment of the present invention.

FIG. 1 is a perspective view showing a multi-layer ceramic capacitor assembly in accordance with an embodiment of the present invention. FIG. 2 is an exploded perspective view showing the multi-layer ceramic capacitor assembly in accordance with an embodiment of the present invention. FIG. 3 is a cross-sectional view showing the multi-layer ceramic capacitor assembly in accordance with an embodiment of the present invention. FIG. 4 is a detailed cross-sectional view showing a multi-layer ceramic capacitor in the multi-layer ceramic capacitor assembly in accordance with an embodiment of the present invention.

As illustrated in FIG. 1 to FIG. 4, a multi-layer ceramic capacitor assembly 1000 in accordance with an embodiment of the present invention includes a multi-layer ceramic capacitor 100 and an electrode-forming substrate 200 and may further include a first bonding part 300, a circuit board 400, and second bonding parts 500.

The multi-layer ceramic capacitor 100 may include a laminate 110, which has dielectric layers 111 and internal electrodes 113 laminated alternately therein, and an external electrode 120, which is electrically connected with the internal electrodes 113 and formed at an end portion of the laminate 110.

That is, as illustrated in FIG. 4, the laminate 110 of the multi-layer ceramic capacitor 100 is formed by successively laminating the dielectric layers 111, which contain ceramic particles, and the internal electrodes 113 alternately.

The external electrodes 120 are provided in a pair formed at either end portion of the laminate 110, and the internal electrodes 113 may each be electrically connected with either of the pair of external electrodes 120. The pair of external electrodes 120 may be formed at either end portion of the laminate 110 to face opposite to each other and may be made of a conductive material such as copper.

The electrode-forming substrate 200, which has the multi-layer ceramic capacitor 100 coupled to one surface thereof and has through-holes 210 formed at portions corresponding to where the external electrodes 120 are formed, may be interposed between the multi-layer ceramic capacitor 100 and the circuit board 400 in order to carry out, for example, an insulation function in case the multi-layer ceramic capacitor 100 is mounted on the circuit board 400.

In order for the insulation function to be effective, a surface on which the multi-layer ceramic capacitor 100 is mounted on the circuit board 400 may be entirely covered by the electrode-forming substrate 200, but this may complicate the electrical connection between the multi-layer ceramic capacitor 100 and the circuit board 400.

On the other hand, if the multi-layer ceramic capacitor 100 were physically bonded directly to the circuit board 400 over a large area, vibrations generated by the multi-layer ceramic capacitor 100 might be directly transferred to the circuit board 400, possibly generating an acoustic noise.

Therefore, the multi-layer ceramic capacitor assembly 1000 in accordance with the present embodiment may have the through-holes 210 formed in the electrode-forming substrate 200 covering the surface where the multi-layer ceramic capacitor 100 is installed and thus the multi-layer ceramic capacitor 100 may be electrically connected to the circuit board 400 through these through-holes 210.

Accordingly, since a relatively minimum area of the surface where the multi-layer ceramic capacitor 100 is mounted is exposed, the insulating performance may be enhanced, and the electrical connection may be readily made.

The first bonding part 300, which is formed at portions of the multi-layer ceramic capacitor 100 and the electrode-forming substrate 200 where the external electrodes 120 are not formed, is configured to physically bond the multi-layer ceramic capacitor 100 with the electrode-forming substrate 200.

That is, as illustrated in FIG. 1 to FIG. 3, when the external electrodes 120 are formed at either end portion of the laminate 110, the first bonding part 300 may be formed at a middle portion of the laminate 110.

In such a configuration, the first bonding part 300 may be variably configured, for example, by including an adhesive material to bond the multi-layer ceramic capacitor 100 with the electrode-forming substrate 200 or by including a binding member to lock the multi-layer ceramic capacitor 100 with the electrode-forming substrate 200.

As described above, by further including the first bonding part 300, the multi-layer ceramic capacitor assembly 1000 may separate an electrical connection path from a physical connection path between the multi-layer ceramic capacitor 100 and the electrode-forming substrate 200.

Here, the first bonding part 300 may include a pair of first bonding pads 310, which are integrally formed with the multi-layer ceramic capacitor 100 and the electrode-forming substrate 200, respectively, and a first soldering member 320 configured for soldering the pair of first bonding pads 310 with each other.

That is, the multi-layer ceramic capacitor 100 and the electrode-forming substrate 200 may be bonded to each other more readily and effectively through soldering, which is the most widely used bonding method for mounting the multi-layer ceramic capacitor 100 on the circuit board 400.

The circuit board 400, which has surface electrodes 410 formed on one surface thereof and is coupled to the other surface of the electrode-forming substrate 200 in such a way that the surface electrodes 410 are electrically connected with the external electrodes 120 through the through-holes 210, has a predetermined circuit pattern formed thereon to provide electrical signals to the multi-layer ceramic capacitor 100.

As such, since the electrical connection between the multi-layer ceramic capacitor 100 and the circuit board 400 is made with a minimum area through the through-holes 210, the vibrations of the multi-layer ceramic capacitor 100 may be minimally transferred directly to the circuit board 400.

In the multi-layer ceramic capacitor assembly 1000 in accordance with the present embodiment, the electrode-forming substrate 200 may include current-carrying soldering members 420 configured for soldering the surface electrodes 410 with the external electrodes 120 through the through-holes 210 in such a way that the surface electrodes 410 are electrically connected, respectively, with the external electrodes 120.

That is, the surface electrodes 410 may be electrically connected with the external electrodes 120, respectively, more readily and effectively through soldering. In such a case, by laminating the partially fluid current-carrying soldering members 420 on the surface electrodes 410 and then exerting downward force on the electrode-forming substrate 200 over the current-carrying soldering members 420, the current-carrying soldering members 420 may bulge up through the through-holes 210 to make contact with the external electrodes 120.

The second bonding parts 500, which are formed at portions of the electrode-forming substrate 200 and the circuit board 400 where the surface electrodes 410 are formed and are configured to bond the electrode-forming substrate 200 with the circuit board 400, may physically bond the electrode-forming substrate 200 with the circuit board 400.

The second bonding parts 500 may also be variably configured, for example, by including an adhesive material to bond the electrode-forming substrate 200 with the circuit board 400, or by including a binding member to lock the electrode-forming substrate 200 with the circuit board 400.

As such, by allowing the electrode-forming substrate 200 and the circuit board 400 to be physically bonded with each other through the second bonding parts 500 at portions where the surface electrodes 410 are formed, a physical coupling between the multi-layer ceramic capacitor 100 and the electrode-forming substrate 200 is made at a middle portion of the electrode-forming substrate 200, and a physical coupling between the electrode-forming substrate 200 and the circuit board 400 is made at peripheral portions of the electrode-forming substrate 200.

Accordingly, even if the vibrations of the multi-layer ceramic capacitor 100 were transferred to the electrode-forming substrate 200, the vibrations would have to be transferred to the peripheral portions of the electrode-forming substrate 200 before being eventually transferred to the circuit board 400, providing a relatively inefficient transfer path and thereby possibly minimizing the transfer of the vibrations of the multi-layer ceramic capacitor 100 to the circuit board 400.

Here, the second bonding parts 500 may each include a second bonding pad 510, which is integrally formed with the electrode-forming substrate 200, and a second soldering member 520 configured for soldering the second bonding pad 510 with one of the surface electrodes 410.

In other words, it is possible to bond the electrode-forming substrate 200 with the circuit board 400 more readily and effectively through soldering. Particularly, the soldering between the electrode-forming substrate 200 and the circuit board 400 may be performed in conjunction with the soldering between the multi-layer ceramic capacitor 100 and the electrode-forming substrate 200 through the first bonding part 300, allowing the bonding processes to be performed more readily.

Moreover, in the multi-layer ceramic capacitor assembly 1000 in accordance with the present embodiment, the current-carrying soldering members 420 and the second soldering members 520 may each be integrally formed with each other. Specifically, instead of forming the current-carrying soldering members 420 and the second soldering members 520 separately, the partially fluid current-carrying soldering members 420 may be laminated, respectively, on the surface electrodes 410, and then the electrode-forming substrate 200 may be pressed down over the current-carrying soldering members 420. Then, portions of the current-carrying soldering members 420 that bulge up through the through-holes 210 may naturally become the current-carrying soldering members 420, and portions of the current-carrying soldering members 420 that escape the through-holes 210 and are interposed between the electrode-forming substrate 200 and the circuit board 400 may become the second soldering members 520.

As such, since the current-carrying soldering members 420 and the second soldering members 520 may be integrally formed, processes for electrical connection and physical bonding may be simultaneously performed.

Although certain embodiments of the present invention have been described above, it shall be appreciated that there can be a variety of permutations and modifications of the present invention by those who are ordinarily skilled in the art to which the present invention pertains without departing from the technical ideas and scope of the present invention, which shall be defined by the appended claims. It shall be also appreciated that a large number of other embodiments than the above-described embodiment are included in the claims of the present invention.

What is claimed is:

1. A multi-layer ceramic capacitor assembly comprising:
a multi-layer ceramic capacitor comprising a laminate, the laminate having dielectric layers and internal electrodes laminated alternately therein, and external electrodes being electrically connected with the internal electrodes and disposed at end portions of the laminate;
an electrode-forming substrate coupled to the multi-layer ceramic capacitor and having through-holes disposed to correspond to the external electrodes;
a circuit board having surface electrodes formed on one surface thereof and being coupled to the electrode-forming substrate in such a way that the surface electrodes are electrically connected with the external electrodes through the through-holes; and
a first bonding part disposed between the multi-layer ceramic capacitor and the electrode-forming substrate in a region where the external electrodes are not formed and configured to bond the multi-layer ceramic capacitor with the electrode-forming substrate,
wherein a physical coupling between the multi-layer ceramic capacitor and the electrode-forming substrate is made in a region in which the external electrodes are not formed, and a physical coupling between the electrode-forming substrate and the circuit board is made in a region in which the external electrodes are formed,
wherein the electrode-forming substrate comprises current-carrying soldering members connecting the surface electrodes with the external electrodes through the through-holes in such a way that the surface electrodes are electrically connected, respectively, with the external electrodes,
wherein each of the current-carrying soldering members comprises a first portion displaced in the through-holes, and a second portion displaced between the first portion and one of the surface electrodes, and
wherein a horizontal width of the second portion is longer than a horizontal width of the first portion, and shorter than a horizontal width of one of the surface electrodes.

2. A multi-layer ceramic capacitor assembly comprising:
a multi-layer ceramic capacitor comprising a laminate, the laminate having dielectric layers and internal electrodes laminated alternately therein, and external electrodes being electrically connected with the internal electrodes and disposed at end portions of the laminate;
an electrode-forming substrate coupled to the multi-layer ceramic capacitor and having through-holes disposed to correspond to the external electrodes;
a circuit board having surface electrodes formed on one surface thereof and being coupled to the electrode-forming substrate in such a way that the surface electrodes are electrically connected with the external electrodes through the through-holes; and
a first bonding part disposed between the multi-layer ceramic capacitor and the electrode-forming substrate in a region where the external electrodes are not formed and configured to bond the multi-layer ceramic capacitor with the electrode-forming substrate, wherein the first bonding part comprises:
- a pair of first bonding pads formed integrally with the multi-layer ceramic capacitor and the electrode-forming substrate, respectively; and
- a first soldering member configured for soldering the pair of first bonding pads with each other, wherein the electrode-forming substrate comprises current-carrying soldering members connecting the surface electrodes with the external electrodes through the through-holes in such a way that the surface electrodes are electrically connected, respectively, with the external electrodes, wherein each of the current-carrying soldering members comprises a first portion displaced in the through-holes, and a second portion displaced between the first portion and one of the surface electrodes, and wherein a horizontal width of the second portion is longer than a horizontal width of the first portion, and shorter than a horizontal width of one of the surface electrodes.

\* \* \* \* \*